(12) United States Patent
Du et al.

(10) Patent No.: US 10,878,737 B2
(45) Date of Patent: Dec. 29, 2020

(54) SHIFT REGISTER, GATE DRIVING CIRCUIT, DISPLAY PANEL AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Ruifang Du, Beijing (CN); Haifeng Liu, Beijing (CN); Xiaoye Ma, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 148 days.

(21) Appl. No.: 16/156,617

(22) Filed: Oct. 10, 2018

(65) Prior Publication Data
US 2019/0236995 A1    Aug. 1, 2019

(30) Foreign Application Priority Data
Feb. 1, 2018    (CN) .......................... 2018 1 0101964

(51) Int. Cl.
*G11C 19/00*    (2006.01)
*G09G 3/20*    (2006.01)
(Continued)

(52) U.S. Cl.
CPC ............. *G09G 3/20* (2013.01); *G09G 3/3677* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS 9,691,312 B2 *  6/2017  Wang ..................... G11C 19/28
9,767,751 B2     9/2017  Dai
(Continued)

FOREIGN PATENT DOCUMENTS

CN    104882108 A    9/2015
CN    106486085 A    3/2017
(Continued)

OTHER PUBLICATIONS

First Chinese Office Action dated Jan. 6, 2020, received for corresponding Chinese Application No. 201810101964.3, 18 pages.

*Primary Examiner* — Tuan T Lam
(74) *Attorney, Agent, or Firm* — Kinney & Lange, P.A.

(57) ABSTRACT

Embodiments of the present disclosure provide a shift register, a gate driving circuit, a display panel and a display apparatus. The shift register comprises an inputting sub-circuit, an outputting sub-circuit, a resetting sub-circuit, and a first discharging controlling sub-circuit. The first discharging controlling sub-circuit is coupled to a first controlling signal inputting terminal, a second controlling signal inputting terminal and a signal outputting terminal, and configured to provide a second controlling signal from the second controlling signal inputting terminal to the signal outputting terminal under a control of a first controlling signal from the first controlling signal inputting terminal. The signal outputting terminal is set to a high level by inputting the first controlling signal and the second controlling signal to the shift register.

12 Claims, 5 Drawing Sheets

(51) Int. Cl.
*G11C 19/28* (2006.01)
*G09G 3/36* (2006.01)
(52) U.S. Cl.
CPC .......... *G09G 2310/0286* (2013.01); *G09G 2310/061* (2013.01)

(56) References Cited

U.S. PATENT DOCUMENTS

| | | | | |
|---|---|---|---|---|
| 10,032,424 | B2* | 7/2018 | Xu | G09G 3/3677 |
| 2006/0291610 | A1* | 12/2006 | Lo | G11C 19/28 |
| | | | | 377/64 |
| 2008/0101529 | A1* | 5/2008 | Tobita | G09G 3/3677 |
| | | | | 377/64 |
| 2008/0219401 | A1* | 9/2008 | Tobita | G09G 3/3677 |
| | | | | 377/79 |
| 2009/0021662 | A1* | 1/2009 | Chang | G02F 1/1368 |
| | | | | 349/46 |
| 2010/0002827 | A1* | 1/2010 | Shih | G09G 3/3677 |
| | | | | 377/57 |
| 2010/0245301 | A1* | 9/2010 | Shang | G09G 3/3677 |
| | | | | 345/204 |
| 2011/0150169 | A1* | 6/2011 | Lin | G11C 19/28 |
| | | | | 377/64 |
| 2014/0072093 | A1* | 3/2014 | Shang | G09G 3/20 |
| | | | | 377/69 |
| 2014/0354523 | A1* | 12/2014 | So | G09G 3/3677 |
| | | | | 345/100 |
| 2015/0002504 | A1* | 1/2015 | Jo | G09G 3/3677 |
| | | | | 345/213 |
| 2015/0318053 | A1* | 11/2015 | Zhang | G09G 3/36 |
| | | | | 377/64 |
| 2015/0339999 | A1* | 11/2015 | Zheng | G11C 19/28 |
| | | | | 345/92 |
| 2016/0300542 | A1* | 10/2016 | Zhang | G11C 19/28 |
| 2016/0351159 | A1* | 12/2016 | Yang | G09G 5/003 |
| 2017/0025068 | A1* | 1/2017 | Jeoung | G11C 19/28 |
| 2017/0162148 | A1* | 6/2017 | Xiao | G02F 1/1362 |
| 2017/0162150 | A1* | 6/2017 | Xiao | G09G 3/36 |
| 2017/0235421 | A1* | 8/2017 | Lin | G02F 1/134309 |
| | | | | 345/173 |
| 2017/0270851 | A1* | 9/2017 | Shang | G11C 19/28 |
| 2017/0270879 | A1* | 9/2017 | Han | G09G 3/3648 |
| 2017/0278473 | A1* | 9/2017 | Shang | G09G 3/36 |

FOREIGN PATENT DOCUMENTS

| | | |
|---|---|---|
| CN | 106652875 A | 5/2017 |
| CN | 106920519 A | 7/2017 |
| CN | 107564491 A | 1/2018 |
| KR | 20170078165 A | 7/2017 |

* cited by examiner

SHIFT REGISTER, GATE DRIVING CIRCUIT, DISPLAY PANEL AND DISPLAY APPARATUS

CROSS-REFERENCE TO RELATED APPLICATION

This application claims priority to Chinese patent application No. 201810101964.3, filed on Feb. 1, 2018, the disclosure of which is incorporated herein by reference in its entirety as part of this application.

BACKGROUND

Embodiments of the present disclosure relate to a field of display technologies, and in particular to a shift register, a gate driving circuit comprising the shift register, a display panel, and a display device.

GOA (Gate Driver on Array) technology integrates a gate driving circuit in a peripheral region of a display panel, and implements inputting of data signals to pixel units by supplying a gate scanning signal to a gate of respective switching element in a pixel region through a gate driving circuit and turning on each switching element line by line. When the power supply is turned off, the display panel usually runs the Xao (Output All-on) function. Due to this, VGL and VGH of the PCB segment are shortened together, and all gate lines are at a high level. Thus, switching elements for pixels in the display panel are turned on, so that pixel electrodes discharge. However, such an operation can cause charges in a shift register to accumulate, which can further cause transistors to be in a long-term stress state, thereby reducing the reliability thereof.

SUMMARY

A shift register is provided according to an aspect of embodiments of the present disclosure. The shift register can comprise: an inputting sub-circuit, coupled to a signal inputting terminal and a pulling-up node, configured to provide an inputting signal from the signal inputting terminal to the pulling-up node under a control of the inputting signal; an outputting sub-circuit, coupled to the pulling-up node, a clock signal terminal and a signal outputting terminal, and configured to provide a clock signal from the clock signal terminal to the signal outputting terminal under a control of a level at the pulling-up node; a resetting sub-circuit, coupled to the pulling-up node, a first resetting signal terminal and a reference signal terminal, and configured to provide a reference signal from the reference signal terminal to the pulling-up node under a control of a first resetting signal from the first resetting signal terminal; and a first discharging controlling sub-circuit, coupled to a first controlling signal inputting terminal, a second controlling signal inputting terminal and the signal outputting terminal, and configured to provide a second controlling signal from the second controlling signal inputting terminal to the signal outputting terminal under a control of a first controlling signal from the first controlling signal inputting terminal.

In one example, the first discharging controlling sub-circuit may comprise a first switching element having a controlling electrode coupled to the first controlling signal inputting terminal, a first electrode coupled to the second controlling signal inputting terminal and a second electrode coupled to the signal outputting terminal.

In another example, the first discharging controlling sub-circuit may further comprise: a second switching element having a controlling electrode coupled to a second resetting signal terminal, a first electrode coupled to the second controlling signal inputting terminal and a second electrode coupled to the signal outputting terminal.

In another example, the shift register may further comprise a second discharging controlling sub-circuit, wherein the second discharging controlling sub-circuit comprises a third switching element, wherein the third switching element has a controlling electrode coupled to the first controlling signal inputting terminal, a first electrode coupled to the reference signal terminal and a second electrode coupled to the pulling-up node.

In another example, the inputting sub-circuit may comprise: a fourth switching element having a controlling electrode and a first electrode coupled to the signal inputting terminal and a second electrode coupled to the pulling-up node.

In another example, the outputting sub-circuit may comprise: a fifth switching element having a controlling electrode coupled to the pulling-up node, a first electrode coupled to the clock signal terminal and a second electrode coupled to the signal outputting terminal; and a storage capacitor having a first electrode coupled to the pulling-up node and a second electrode coupled to the signal outputting terminal.

In another example, the resetting sub-circuit may comprise a sixth switching element having a controlling electrode coupled to the first resetting signal terminal, a first electrode coupled to the reference signal terminal and a second electrode coupled to the pulling-up node.

In another example, the shift register may further comprise a first pulling-down controlling sub-circuit and a second pulling-down controlling sub-circuit, wherein the first pulling-down controlling sub-circuit is coupled to a first controlling signal terminal, the pulling-up node, the reference signal terminal, and the signal outputting terminal, and is configured to provide the reference signal to a first pulling-down node under a control of the level at the pulling-up node, and to provide the reference signal to the pulling-up node and the signal outputting terminal under a control of a first controlling signal from the first controlling signal terminal; and wherein the second pulling-down controlling sub-circuit is coupled to a second controlling signal terminal, the pulling-up node, the reference signal terminal, and the signal outputting terminal, and is configured to provide the reference signal to a second pulling-down node under a control of the level at the pulling-up node, and to provide the reference signal to the pulling-up node and the signal outputting terminal under a control of a second controlling signal from the second controlling signal terminal.

In another example, the first pulling-down controlling sub-circuit may comprise: a seventh switching element, an eighth switching element, a ninth switching element, a tenth switching element, an eleventh switching element and a twelfth switching element, wherein the seventh switching element has a controlling electrode and a first electrode coupled to the first controlling signal terminal, and a second electrode coupled to a first pulling-down controlling node; the eighth switching element has a controlling electrode coupled to the first pulling-down controlling node, a first electrode coupled to the first controlling signal terminal and a second electrode coupled to the first pulling-down node; the ninth switching element has a controlling electrode coupled to the pulling-up node, a first electrode coupled to the first pulling-down controlling node and a second electrode coupled to the reference signal terminal; the tenth switching element has a controlling electrode coupled to the pulling-up node, a first electrode coupled to the first pulling-down node, and a second electrode coupled to the reference signal terminal; the eleventh switching element has a controlling electrode coupled to the first pulling-down node, a first electrode coupled to the pulling-up node and a second electrode coupled to the reference signal terminal; and the twelfth switching element has a controlling electrode coupled to the first pulling-down node, a first electrode coupled to the signal outputting terminal and a second electrode coupled to the reference signal terminal; and wherein the second pulling-down controlling sub-circuit comprises a thirteenth switching element, a fourteenth switching element, a fifteenth switching element, a sixteenth switching element, a seventeenth switching element and an eighteenth switching element, wherein the thirteenth switching element has a controlling electrode and a first electrode coupled to the second controlling signal terminal and a second electrode coupled to a second pulling-down controlling node; the fourteenth switching element has a controlling electrode coupled to the second pulling-down controlling node, a first electrode coupled to the second controlling signal terminal and a second electrode coupled to the second pulling-down node; the fifteenth switching element has a controlling electrode coupled to the pulling-up node, a first electrode coupled to the second pulling-down controlling node and a second electrode coupled to the reference signal terminal; the sixteenth switching element has a controlling electrode coupled to the pulling-up node, a first electrode coupled to the second pulling-down node and a second electrode coupled to the reference signal terminal; the seventeenth switching element has a controlling electrode coupled to the second pulling-down node, a first electrode coupled to the pulling-up node and a second electrode coupled to the reference signal terminal; and the eighteenth switching element has a controlling electrode coupled to the second pulling-down node, a first electrode coupled to the signal outputting terminal and a second electrode coupled to the reference signal terminal.

A gate driving circuit is provided according to another aspect of the embodiments of the present disclosure. The gate driving circuit comprises: a first controlling signal line; a second controlling signal line; and N stages of cascaded shift registers discussed above, N being an integer greater than 4, wherein each of the N stages of cascaded shift registers has its first controlling signal terminal coupled to the first controlling signal line, and its second controlling signal terminal coupled to the second controlling signal line, wherein the $(n+4)^{th}$ stage of the shift register has the signal outputting terminal coupled to the first resetting signal terminal of the $n^{th}$ stage of the shift register; wherein n is an integer and $N-4 \geq n \geq 1$.

For example, the first discharging controlling sub-circuit may comprise: a second switching element having a controlling electrode coupled to the second resetting signal terminal, a first electrode coupled to the second controlling signal inputting terminal and a second electrode coupled to the signal outputting terminal; wherein the $(n+3)^{th}$ stage of the shift register has the signal outputting terminal coupled to the second resetting signal terminal of the $n^{th}$ stage of the shift register.

According to yet another aspect of the embodiments of the present disclosure, there is provided a display panel comprising the gate driving circuit discussed above.

According to still another aspect of the embodiments of the present disclosure, there is provided a display device comprising the display panel discussed above.

BRIEF DESCRIPTION OF THE DRAWINGS

The above and/or additional aspects and advantages of the present disclosure will become apparent and readily understood from the following description of the embodiments in combination with the drawings, in which:

FIG. 1b shows a circuit diagram illustrating an embodiment of FIG. 1a.

FIG. 1c shows a circuit diagram illustrating another embodiment of FIG. 1a.

FIG. 2b shows a circuit diagram illustrating an embodiment of FIG. 2a.

FIG. 3b shows a circuit diagram illustrating an embodiment of FIG. 3a.

DETAILED DESCRIPTION

Figure 1A:
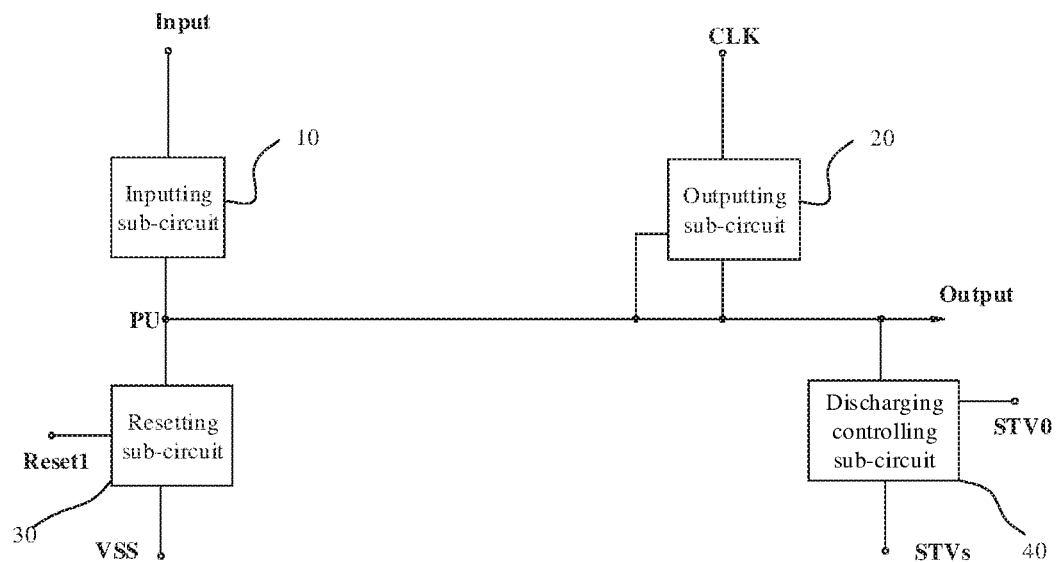
FIG. 1a shows a circuit block diagram illustrating a shift register according to embodiments of the present disclosure.

Embodiments of the present disclosure are described in detail below. Examples of the embodiments are illustrated in the drawings, wherein the same or similar reference numerals are used to indicate the same or similar elements or elements having the same or similar functions. The embodiments described below with reference to the accompanying drawings are intended to be illustrative of the embodiments of the invention, and are not to be construed as limiting.

In an embodiment of the present disclosure, there is provided a shift register. As shown in FIG. 1a, the shift register according to the embodiment of the present disclosure includes an inputting sub-circuit 10, an outputting sub-circuit 20, a resetting sub-circuit 30, and a discharging controlling sub-circuit 40.

The inputting sub-circuit 10 is coupled to a signal inputting terminal Input and a pulling-up node PU, configured to provide an inputting signal from the signal inputting terminal Input to the pulling-up node PU under a control of the inputting signal.

The outputting sub-circuit 20 is coupled to the pulling-up node PU, a clock signal terminal CLK and a signal outputting terminal Output, and configured to provide a clock signal from the clock signal terminal to the signal outputting terminal Output under a control of a level at the pulling-up node PU.

The resetting sub-circuit 30 is coupled to the pulling-up node PU, a first resetting signal terminal Reset1 and a reference signal terminal VSS, and configured to provide a reference signal from the reference signal terminal VSS to the pulling-up node PU under a control of a first resetting signal from the first resetting signal terminal Reset1.

The discharging controlling sub-circuit 40 may include: a first discharging controlling sub-circuit coupled to a first controlling signal inputting terminal STV0, a second controlling signal inputting terminal STVs and the signal outputting terminal Output, and configured to provide a second controlling signal from the second controlling signal inputting terminal STVs to the signal outputting terminal Output under a control of a first controlling signal from the first controlling signal inputting terminal STV0.

According to the embodiment of the present disclosure, the first discharging controlling sub-circuit transmits the second controlling signal to the signal outputting terminal Output under the control of the first controlling signal inputting terminal STV0, so that the signal outputting terminal Output is at a high level. Thus, the gate line coupled to the shift register is set to a high level, effectively discharging a pixel region for the gate line.

Figure 1B:
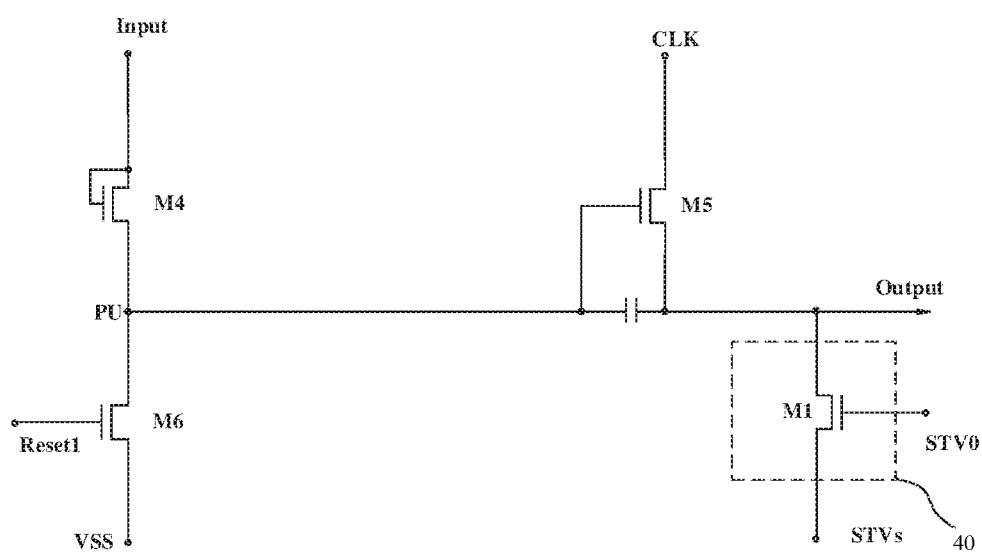

According to an example of the embodiment of the present disclosure, as shown in FIG. 1b, the first discharging controlling sub-circuit may comprise a first switching element M1 having a controlling electrode coupled to the first controlling signal inputting terminal STV0, a first electrode coupled to the second controlling signal inputting terminal STVs and a second electrode coupled to the signal outputting terminal Output.

The first switching element M1 provides the second controlling signal to the signal outputting terminal Output under the control of the first controlling signal from the first controlling signal inputting terminal STV0, so that the signal outputting terminal Output is at a high level.

Figure 1C:
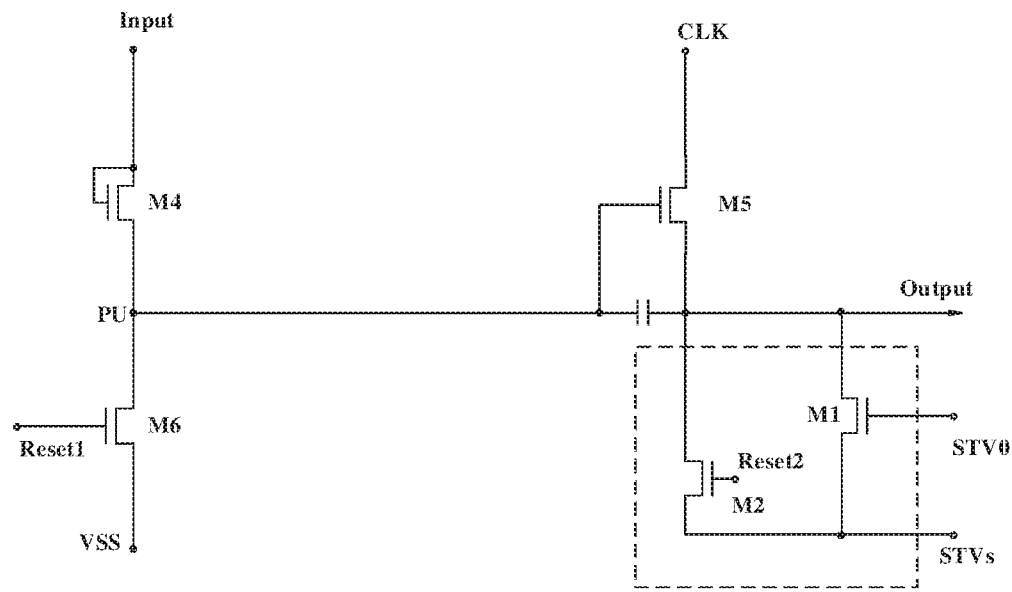

As shown in FIG. 1c, the first discharging controlling sub-circuit may further include a second switching element M2 having a controlling electrode coupled to a second resetting signal terminal Reset2, a first electrode coupled to the second controlling signal inputting terminal STVs and a second electrode coupled to the signal outputting terminal Output.

Under the control of the second resetting signal from the second resetting signal terminal Reset2, the second switching element M2 provides the second controlling signal from the second controlling signal inputting terminal STVs to the signal outputting terminal Output. The signal outputting terminal Output is at a level obtained by superimposing the level at the first switching element M1 on the level at the second switching element M2. This may enable a better discharging of the pixel region to which the shift register is connected.

Further, resistances of the first switching element M1 and the second switching element M2 in the first discharging controlling sub-circuit 41 can be determined according to a load of the pixel region, so that the discharging capacity of the first discharging controlling sub-circuit 41 is maximized, enabling that the pixel region coupled to the shift register is capable of releasing charges in time.

Figure 2A:
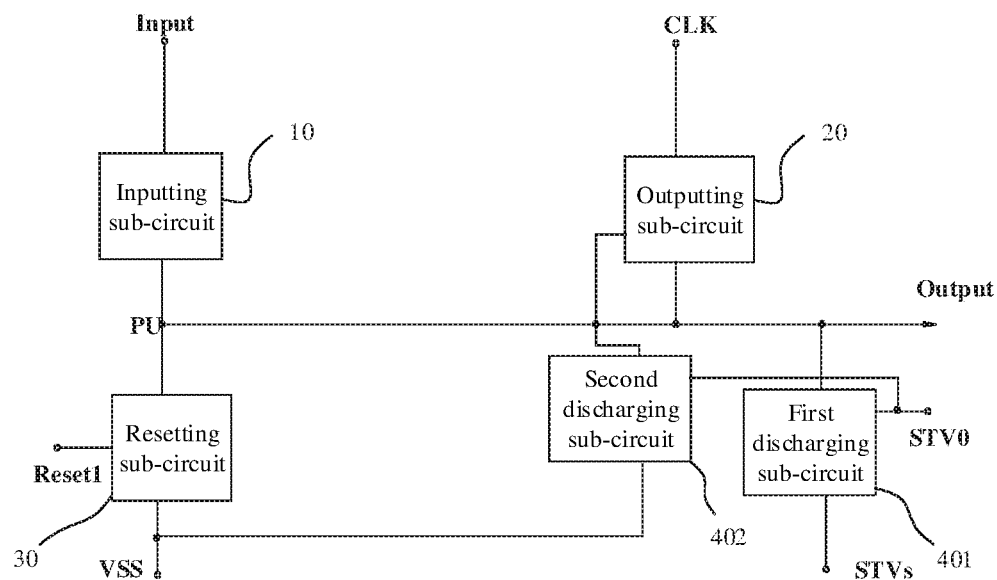
FIG. 2a shows a circuit block diagram illustrating another shift register according to the embodiments of the present disclosure.
Figure 2B:
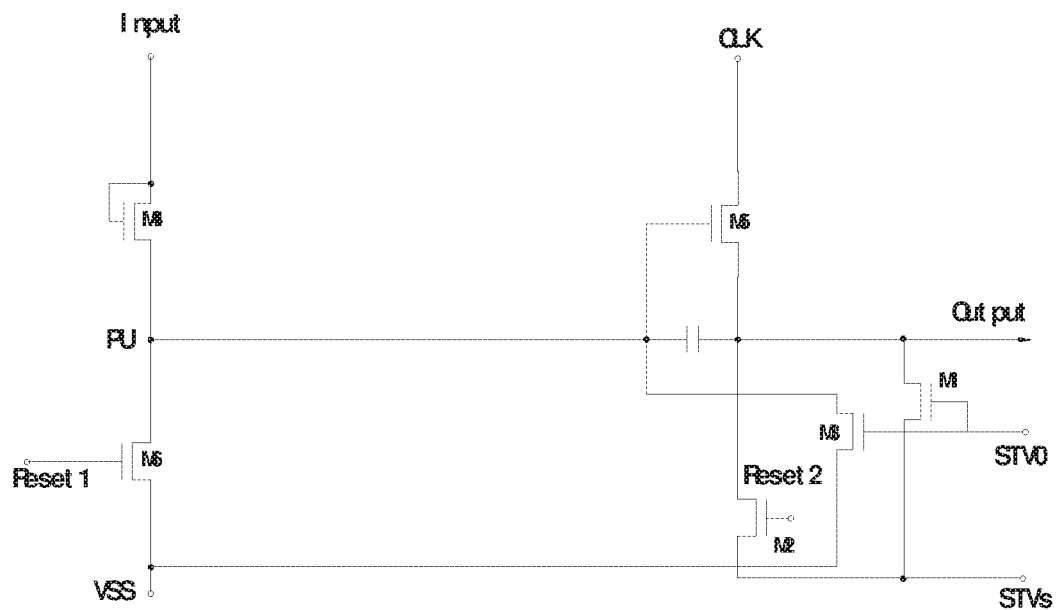

As shown in FIGS. 2a-2b, the discharging controlling sub-circuit may further comprise a second discharging controlling sub-circuit 42. The second discharging controlling sub-circuit 42 may comprise a third switching element M3 having a controlling electrode coupled to the first controlling signal inputting terminal STV0, a first electrode coupled to the reference signal terminal VSS and a second electrode coupled to the pulling-up node PU.

The third switching element M3 provides a reference signal from the reference signal terminal VSS to the pulling-up node PU under the control of the first controlling signal from the first controlling signal inputting terminal STV0, so that the level at the pulling-up node PU is pulled-down, thereby releasing charges accumulated in the shift register.

The above description merely exemplifies detailed structures of the first discharging controlling sub-circuit 41 and the second discharging controlling sub-circuit 42. However, the specific structures of first discharging controlling sub-circuit 41 and the second discharging controlling sub-circuit 42 are not limited to the structures illustrated above, and may be other structures known to those skilled in the art which are not described herein.

As shown in FIG. 1b, in order to provide an inputting signal from the signal inputting terminal Input to the pulling-up node PU, the inputting sub-circuit 10 may comprise: a fourth switching element M4 having a controlling electrode and a first electrode coupled to the signal inputting terminal Input and a second electrode coupled to the pulling-up node PU.

The fourth switching element M4 provides the inputting signal to the pulling-up node PU under the control of the inputting signal from the signal inputting terminal Input.

The above description merely exemplifies detailed structure of the inputting sub-circuit 10. However, the specific structure of the inputting sub-circuit 10 is not limited to the structure above-described, and may be other structures known to those skilled in the art which are not described herein.

Referring to FIG. 1b, the outputting sub-circuit 20 may include a fifth switching element M5 having a controlling electrode coupled to the pulling-up node PU, a first electrode coupled to the clock signal terminal CLK and a second electrode coupled to the signal outputting terminal Output; and a storage capacitor C having a first electrode coupled to the pulling-up node PU and a second electrode coupled to the signal outputting terminal Output.

The above description merely exemplifies detailed structure of the outputting sub-circuit 20. However, the specific structure of the outputting sub-circuit 20 is not limited to the structure above-described, and may be other structures known to those skilled in the art which are not described herein.

Under the control of the level at the pulling-up node PU, the fifth switching element M5 provides the clock signal from the clock signal terminal CLK to the signal outputting terminal Output, so that the signal outputting terminal Output may output a gate scanning signal.

Referring to FIG. 1b, the resetting sub-circuit 30 may include a sixth switching element M6 having a controlling electrode coupled to the first resetting signal terminal Reset1, a first electrode coupled to the reference signal terminal VSS and a second electrode coupled to the pulling-up node PU.

The sixth switching element M6 provides a reference signal from the reference signal terminal VSS to the pulling-up node PU under the control of the first resetting signal from the first resetting signal terminal Reset1, enabling resetting of the pulling-up node PU.

The above description merely exemplifies detailed structure of the resetting sub-circuit 30. However, the specific structure of the resetting sub-circuit 30 is not limited to the structure above-described, and may be other structures known to those skilled in the art which are not described herein.

Figure 3A:
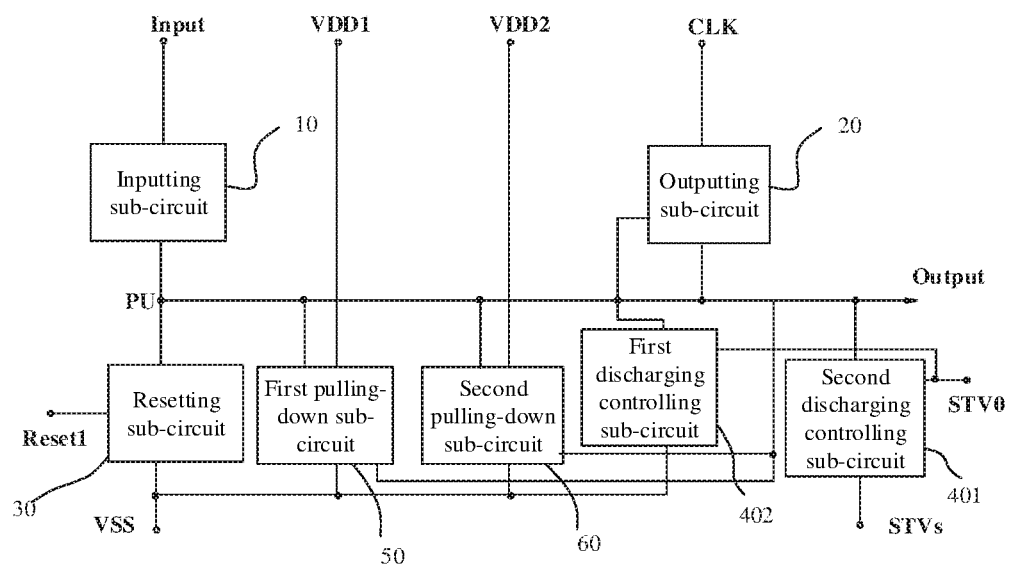
FIG. 3a shows a circuit block diagram illustrating another shift register according to the embodiments of the present disclosure.

As shown in FIG. 3a, the shift register may further comprise a first pulling-down controlling sub-circuit 50 and a second pulling-down controlling sub-circuit 60. The first pulling-down controlling sub-circuit 50 is coupled to a first controlling signal terminal VDD1, the pulling-up node PU, the reference signal terminal VSS, and the signal outputting terminal Output, and is configured to provide the reference signal to a first pulling-down node PD1 under a control of the level at the pulling-up node PU, and to provide the reference signal to the pulling-up node PU and the signal outputting terminal Output under a control of a first controlling signal from the first controlling signal terminal VDD1.

The second pulling-down controlling sub-circuit 60 is coupled to a second controlling signal terminal VDD2, the pulling-up node PU, the reference signal terminal VSS, and the signal outputting terminal Output, and is configured to provide the reference signal VSS to a second pulling-down node PD2 under a control of the level at the pulling-up node PU, and to provide the reference signal to the pulling-up node PU and the signal outputting terminal Output under a control of a second controlling signal from the second controlling signal terminal VDD2.

The first controlling signal terminal VDD1 and the second controlling signal terminal VDD2 may be configured to input controlling signals alternately. For example, the first controlling signal terminal VDD1 and the second controlling signal terminal VDD2 alternately input the controlling signals, so as to control the first pulling-down controlling sub-circuit 50 and the second pulling-down controlling sub-circuit 60 to operate alternately. Certainly, the duration for the controlling signals alternately inputted by the first controlling signal terminal VDD1 and the second controlling signal terminal VDD2 may be a multiple of the duration for frame scanning, or may be the same as the period of the clock signal from the clock signal terminal CLK or a multiple thereof, which is not limited herein.

Figure 3B:
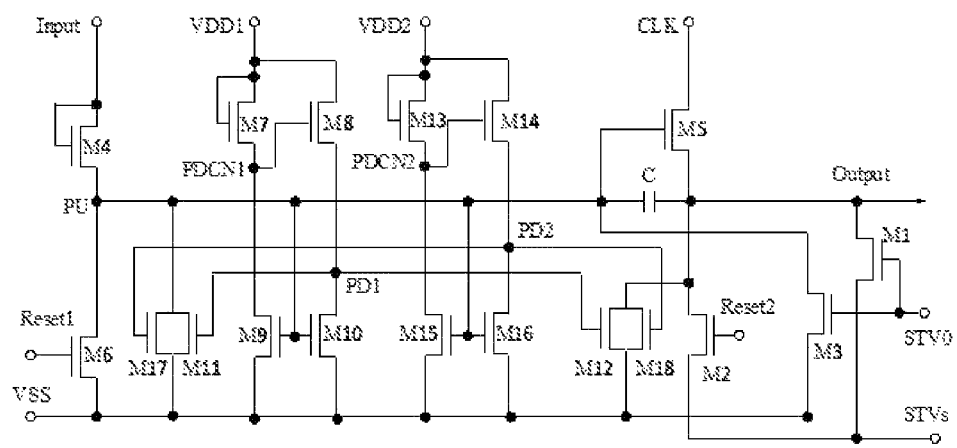

As shown in FIG. 3b, in the above shift register of the embodiment of the present disclosure, the first pulling-down controlling sub-circuit 50 may comprise: a seventh switching element M7, an eighth switching element M8, a ninth switching element M9, a tenth switching element M10, an eleventh switching element M11 and a twelfth switching element M12. The seventh switching element M7 has a controlling electrode and a first electrode coupled to the first controlling signal terminal VDD1, and a second electrode coupled to a first pulling-down controlling node PDCN1. The eighth switching element M8 has a controlling electrode coupled to the first pulling-down controlling node PDCN1, a first electrode coupled to the first controlling signal terminal VDD1 and a second electrode coupled to the first pulling-down node PD1. The ninth switching element M9 has a controlling electrode coupled to the pulling-up node PU, a first electrode coupled to the first pulling-down controlling node PDCN1 and a second electrode coupled to the reference signal terminal VSS. The tenth switching element M10 has a controlling electrode coupled to the pulling-up node PU, a first electrode coupled to the first pulling-down node PD1, and a second electrode coupled to the reference signal terminal VSS. The eleventh switching element M11 has a controlling electrode coupled to the first pulling-down node PD1, a first electrode coupled to the pulling-up node PU and a second electrode coupled to the reference signal terminal VSS. The twelfth switching element M12 has a controlling electrode coupled to the first pulling-down node PD1, a first electrode coupled to the signal outputting terminal Output and a second electrode coupled to the reference signal terminal VSS. The second pulling-down controlling sub-circuit 60 comprises a thirteenth switching element M13, a fourteenth switching element M14, a fifteenth switching element M15, a sixteenth switching element M16, a seventeenth switching element M17 and an eighteenth switching element M18. The thirteenth switching element M13 has a controlling electrode and a first electrode coupled to the second controlling signal terminal VDD2 and a second electrode coupled to a second pulling-down controlling node PDCN2. The fourteenth switching element M14 has a controlling electrode coupled to the second pulling-down controlling node PDCN2, a first electrode coupled to the second controlling signal terminal VDD2 and a second electrode coupled to the second pulling-down node PD2. The fifteenth switching element M15 has a controlling electrode coupled to the pulling-up node PU, a first electrode coupled to the second pulling-down controlling node PDCN2 and a second electrode coupled to the reference signal terminal VSS. The sixteenth switching element M16 has a controlling electrode coupled to the pulling-up node PU, a first electrode coupled to the second pulling-down node PD2 and a second electrode coupled to the reference signal terminal VSS. The seventeenth switching element M17 has a controlling electrode coupled to the second pulling-down node PD2, a first electrode coupled to the pulling-up node PU and a second electrode coupled to the reference signal terminal VSS. The eighteenth switching element M18 has a controlling electrode coupled to the second pulling-down node PD2, a first electrode coupled to the signal outputting terminal Output and a second electrode coupled to the reference signal terminal VSS.

The seventh switching element M7 provides the first controlling signal to the first pulling-down controlling node PDCN1 under the control of the first controlling signal from the first controlling signal terminal VDD1. The eighth switching element M8 provides the first controlling signal from the first controlling signal terminal VDD1 to the first pulling-down node PD1 under the control of the first pulling-down controlling node PDCN1. The ninth switching element M9 provides the reference signal from the reference signal terminal VSS to the first pulling-down controlling node PDCN1 under the control of the pulling-up node PU. The tenth switching element M10 provides the reference signal from the reference signal terminal VSS to the first pulling-down node PD1 under the control of the pulling-up node PU. The eleventh switching element M11 provides the reference signal from the reference signal terminal VSS to the pulling-up node PU under the control of the first pulling-down node PD1. The twelfth switching element M12 provides a reference signal from the reference signal terminal VSS to the signal outputting terminal Output under the control of the first pulling-down node PD1.

The thirteenth switching element M13 provides the second controlling signal to the second pulling-down controlling node PDCN2 under the control of the second controlling signal from the second controlling signal terminal VDD2. The fourteenth switching element M14 provides the second controlling signal from the second controlling signal terminal VDD2 to the second pulling-down node PD2 under the control of the second pulling-down controlling node PDCN2. The fifteenth switching element M15 provides the reference signal from the reference signal terminal VSS to the second pulling-down controlling node PDCN2 under the control of the pulling-up node PU. The sixteenth switching element M16 provides the reference signal from the reference signal terminal VSS to the second pulling-down node PD2 under the control of the pulling-up node PU. The seventeenth switching element M17 provides the reference signal from the reference signal terminal VSS to the pulling-up node PU under the control of the second pulling-down node PD2. The eighteenth switching element M18 provides a reference signal from the reference signal terminal VSS to the signal outputting terminal Output under the control of the second pulling-down node PD2.

In the above embodiments of the shift register, all of the switching elements may be MOS (Metal Oxide Semiconductor) field effect transistors, which may all employ P-type MOS transistors or N-type MOS transistors. It should be noted that the levels at the signals from respective signal terminals will be changed depending on different types of transistors.

Based on the above configuration, the operation of the shift register in the embodiment will be specifically described by taking all of the switching elements being N-type MOS transistors as an example, wherein the reference signal from the reference signal terminal VSS as discussed above is a low level signal.

In response to the power of the display device being turned off, the first controlling signal inputting terminal Input STV0 inputs the first controlling signal, and the second controlling signal inputting terminal STVs inputs the second controlling signal. The first switching element M1 is turned on, and the second controlling signal input by the second controlling signal inputting terminal Input STVs is supplied to the signal outputting terminal Output. Thus, the signal outputting terminal Output is at a high level. When the second resetting signal inputting terminal Reset2 inputs the second resetting signal, the second switching element M2 is turned on. Thus, the second controlling signal input by the second controlling signal inputting terminal STVs is supplied to the signal outputting terminal Output through the second switching element M2, so that the signal outputting terminal is set to a higher level. This further enhances the efficiency of pulling-up the level at the signal outputting terminal Output by the second controlling signal, ensuring the discharging effect of the pixel region and eliminating the shutdown afterimage.

The third switching element M3 applies the charges remaining at the pulling-up node PU onto the reference signal through the third switching element M3, under the control of the first controlling signal from the first controlling signal inputting terminal Input STV0. When the sixth switching element M6 is turned on under the control of the first resetting signal from the first resetting signal terminal Reset1, the reference signal may be supplied to the pulling-up node PU through the sixth switching element M6. The charges remaining at the pulling-up node PU is applied onto the reference signal through the six switching element M6 directly, which may further increase the discharging efficiency of the pulling-up node PU.

Figure 4:
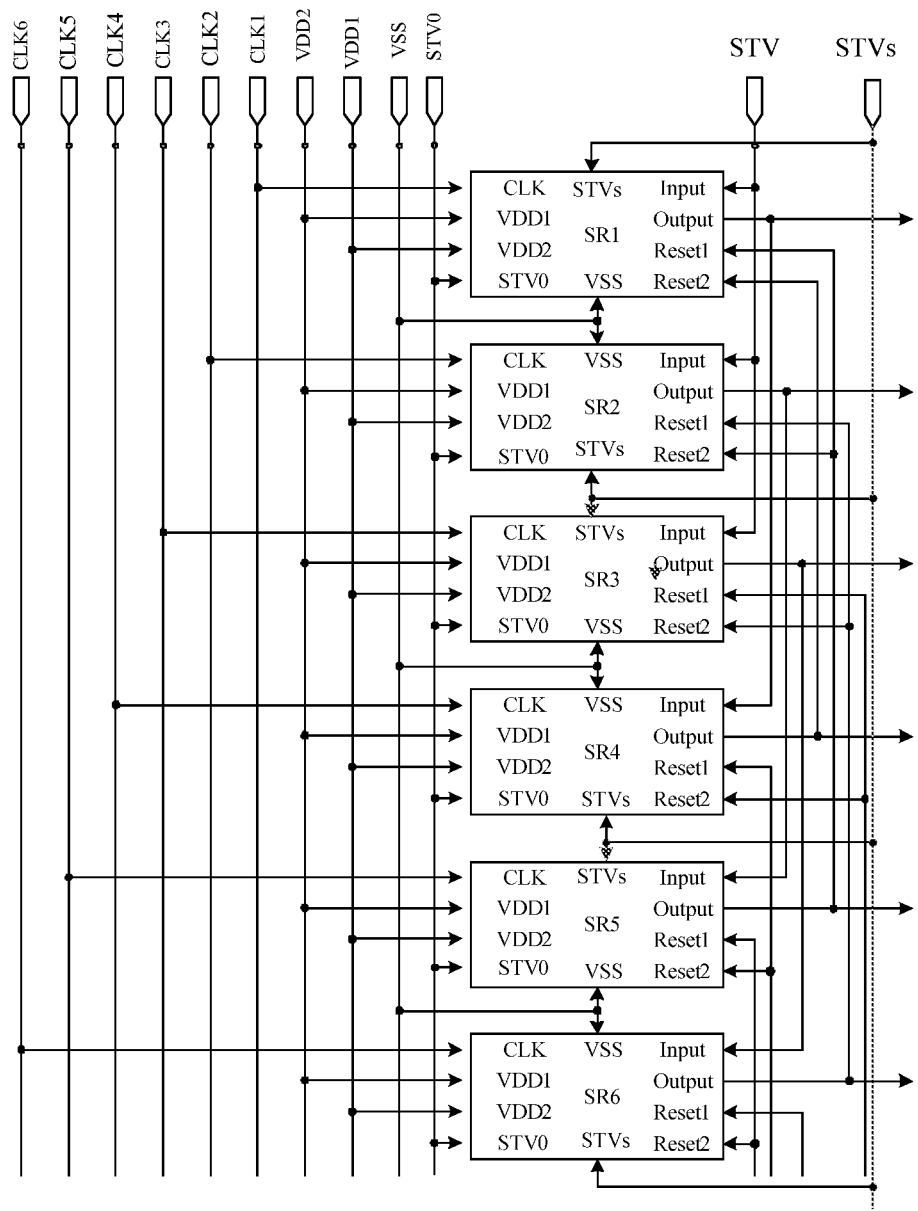
FIG. 4 shows a schematic diagram of a gate driving circuit according to the embodiments of the present disclosure.

The embodiments of the present disclosure also provides a gate driving circuit. As shown in FIG. 4, it includes N stages of cascaded shift registers of any of the above embodiments, N being an integer greater than 4. The $(n+3)^{th}$ stage of the shift register has the signal outputting terminal Output coupled to the second resetting signal terminal Reset2 of the $n^{th}$ stage of the shift register. The $(n+4)^{th}$ stage of the shift register has the signal outputting terminal Output coupled to the first resetting signal terminal Reset1 of the $n^{th}$ stage of the shift register, wherein n is an integer and N−4≥n≥1.

Based on the cascade manner of the gate driving circuit, the discharging of an active display area can be realized.

Embodiments of the present disclosure also provide a display panel including the above-described gate driving circuit.

In the embodiments, the display panel may comprise an LCD display panel, an OLED display panel, a PLED display panel, a PDP display panel, etc., which is not specifically limited herein.

Embodiments of the present disclosure also provide a display device including the display panel discussed above. In the embodiments, the display device may include any product or component having a display function, such as a mobile phone, a tablet, a television, a notebook computer, a learning machine, a digital frame, a navigator, and the like.

The above description only illustrates some of the embodiments of the present disclosure. It will be apparent to those skilled in the art that various modifications and changes can be made in the present disclosure without departing from the spirit and scope of the disclosure. Thus, the present invention is intended to cover the modifications and the changes.

The invention claimed is:

1. A shift register comprising:
    an inputting sub-circuit coupled to a signal inputting terminal and a pulling-up node, the inputting sub-circuit configured to provide an inputting signal from the signal inputting terminal to the pulling-up node under a control of the inputting signal;
    an outputting sub-circuit coupled to the pulling-up node, a clock signal terminal, and a signal outputting terminal, the outputting sub-circuit configured to provide a clock signal from the clock signal terminal to the signal outputting terminal under a control of a level at the pulling-up node;
    a resetting sub-circuit coupled to the pulling-up node, a first resetting signal terminal and a reference signal terminal, the resetting sub-circuit configured to provide a reference signal from the reference signal terminal to the pulling-up node under a control of a first resetting signal from the first resetting signal terminal;
    a first discharging controlling sub-circuit coupled to a first controlling signal inputting terminal, a second controlling signal inputting terminal and the signal outputting terminal, the first discharging controlling sub-circuit configured to provide a second controlling signal from the second controlling signal inputting terminal to the signal outputting terminal under a control of a first controlling signal from the first controlling signal inputting terminal; and
    a second discharging controlling sub-circuit, wherein the second discharging controlling sub-circuit comprises a third switching element;
    wherein the third switching element has a controlling electrode coupled to the first controlling signal inputting terminal, a first electrode coupled to the reference signal terminal and a second electrode coupled to the pulling-up node.

2. The shift register of claim 1, wherein the first discharging controlling sub-circuit comprises a first switching element having a controlling electrode coupled to the first controlling signal inputting terminal, a first electrode coupled to the second controlling signal inputting terminal, and a second electrode coupled to the signal outputting terminal.

3. The shift register of claim 2, wherein the first discharging controlling sub-circuit further comprises:
    a second switching element having a controlling electrode coupled to a second resetting signal terminal, a first electrode coupled to the second controlling signal inputting terminal, and a second electrode coupled to the signal outputting terminal.

4. The shift register of claim 1, wherein the inputting sub-circuit comprises:
    a fourth switching element having a controlling electrode and a first electrode coupled to the signal inputting terminal and a second electrode coupled to the pulling-up node.

5. The shift register of claim 1, wherein the outputting sub-circuit comprises:
    a fifth switching element having a controlling electrode coupled to the pulling-up node, a first electrode coupled to the clock signal terminal, and a second electrode coupled to the signal outputting terminal; and a storage capacitor having a first electrode coupled to the pulling-up node and a second electrode coupled to the signal outputting terminal.

6. The shift register of claim 1, wherein the resetting sub-circuit comprises:
a sixth switching element having a controlling electrode coupled to the first resetting signal terminal, a first electrode coupled to the reference signal terminal, and a second electrode coupled to the pulling-up node.

7. The shift register of claim 1, further comprising a first pulling-down controlling sub-circuit and a second pulling-down controlling sub-circuit,
wherein the first pulling-down controlling sub-circuit is coupled to a first controlling signal terminal, the pulling-up node, the reference signal terminal, and the signal outputting terminal, and is configured to provide the reference signal to a first pulling-down node under a control of the level at the pulling-up node, and to provide the reference signal to the pulling-up node and the signal outputting terminal under a control of a first controlling signal from the first controlling signal terminal; and
wherein the second pulling-down controlling sub-circuit is coupled to a second controlling signal terminal, the pulling-up node, the reference signal terminal, and the signal outputting terminal, and is configured to provide the reference signal to a second pulling-down node under a control of the level at the pulling-up node, and to provide the reference signal to the pulling-up node and the signal outputting terminal under a control of a second controlling signal from the second controlling signal terminal.

8. The shift register of claim 7, wherein the first pulling-down controlling sub-circuit comprises: a seventh switching element, an eighth switching element, a ninth switching element, a tenth switching element, an eleventh switching element and a twelfth switching element, wherein:
the seventh switching element has a controlling electrode and a first electrode coupled to the first controlling signal terminal, and a second electrode coupled to a first pulling-down controlling node;
the eighth switching element has a controlling electrode coupled to the first pulling-down controlling node, a first electrode coupled to the first controlling signal terminal and a second electrode coupled to the first pulling-down node;
the ninth switching element has a controlling electrode coupled to the pulling-up node, a first electrode coupled to the first pulling-down controlling node and a second electrode coupled to the reference signal terminal;
the tenth switching element has a controlling electrode coupled to the pulling-up node, a first electrode coupled to the first pulling-down node, and a second electrode coupled to the reference signal terminal;
the eleventh switching element has a controlling electrode coupled to the first pulling-down node, a first electrode coupled to the pulling-up node and a second electrode coupled to the reference signal terminal; and
the twelfth switching element has a controlling electrode coupled to the first pulling-down node, a first electrode coupled to the signal outputting terminal and a second electrode coupled to the reference signal terminal;
wherein the second pulling-down controlling sub-circuit comprises a thirteenth switching element, a fourteenth switching element, a fifteenth switching element, a sixteenth switching element, a seventeenth switching element and an eighteenth switching element, wherein:
the thirteenth switching element has a controlling electrode and a first electrode coupled to the second controlling signal terminal and a second electrode coupled to a second pulling-down controlling node;
the fourteenth switching element has a controlling electrode coupled to the second pulling-down controlling node, a first electrode coupled to the second controlling signal terminal and a second electrode coupled to the second pulling-down node;
the fifteenth switching element has a controlling electrode coupled to the pulling-up node, a first electrode coupled to the second pulling-down controlling node and a second electrode coupled to the reference signal terminal;
the sixteenth switching element has a controlling electrode coupled to the pulling-up node, a first electrode coupled to the second pulling-down node and a second electrode coupled to the reference signal terminal;
the seventeenth switching element has a controlling electrode coupled to the second pulling-down node, a first electrode coupled to the pulling-up node and a second electrode coupled to the reference signal terminal; and
the eighteenth switching element has a controlling electrode coupled to the second pulling-down node, a first electrode coupled to the signal outputting terminal and a second electrode coupled to the reference signal terminal.

9. A gate driving circuit, comprising:
a first controlling signal line;
a second controlling signal line; and
N stages of cascaded shift registers of claim 1, N being an integer greater than 4, wherein each of the N stages of cascaded shift registers has its first controlling signal terminal coupled to the first controlling signal line, and its second controlling signal terminal coupled to the second controlling signal line;
wherein the $(n+4)^{th}$ stage of the shift register has the signal outputting terminal coupled to the first resetting signal terminal of the $n^{th}$ stage of the shift register;
wherein n is an integer and $N-4 \geq n \geq 1$.

10. The gate driving circuit of claim 9, wherein the first discharging controlling sub-circuit comprises: a second switching element having a controlling electrode coupled to a second resetting signal terminal, a first electrode coupled to the second controlling signal inputting terminal and a second electrode coupled to the signal outputting terminal;
wherein the $(n+3)^{th}$ stage of the shift register has the signal outputting terminal coupled to the second resetting signal terminal of the $n^{th}$ stage of the shift register.

11. A display panel comprising the gate driving circuit of claim 9.

12. A display device comprising the display panel of claim 11.

* * * * *